(12) United States Patent
Hou et al.

(10) Patent No.: US 10,288,974 B2
(45) Date of Patent: May 14, 2019

(54) BORDERLESS DISPLAY WITH CURVED EDGES

(71) Applicant: Amazon Technologies, Inc., Seattle, WA (US)

(72) Inventors: Weihsin Hou, Fremont, CA (US); Robert Arthur Sprague, Saratoga, CA (US); Chin Siong Khor, San Jose, CA (US); Siddharth Gupta, San Bruno, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 284 days.

(21) Appl. No.: 15/253,553

(22) Filed: Aug. 31, 2016

(65) Prior Publication Data

US 2017/0293194 A1    Oct. 12, 2017

Related U.S. Application Data

(60) Provisional application No. 62/319,187, filed on Apr. 6, 2016.

(51) Int. Cl.
*G02B 26/00* (2006.01)
*G02F 1/167* (2019.01)
(Continued)

(52) U.S. Cl.
CPC ............... *G02F 1/167* (2013.01); *G02B 1/14* (2015.01); *G02F 1/1333* (2013.01); *G02F 1/1368* (2013.01); *G02F 1/13306* (2013.01); *G02F 1/133305* (2013.01); *G06F 1/1626* (2013.01); *G06F 1/1637* (2013.01); *G06F 1/1652* (2013.01); *G02F 2201/503* (2013.01); *G02F 2202/28* (2013.01); *H01L 51/0097* (2013.01)

(58) Field of Classification Search
CPC .................................. G02B 1/14; G02F 1/167
See application file for complete search history.

(56) References Cited

U.S. PATENT DOCUMENTS 8,749,476 B2    6/2014  Roh et al.
9,087,488 B1    7/2015  Zehner
(Continued)

OTHER PUBLICATIONS

Author unknown; Annex to Form PCT/ISA/206 Communication Relating to the Results of the Partial International Search of PCT/US2017/025909; dated Jan. 27, 2017; 12 pgs.
(Continued)

*Primary Examiner* — Joseph P Martinez
(74) *Attorney, Agent, or Firm* — K&L Gates LLP

(57) ABSTRACT

An electronic device with a flexible display subassembly is provided. The display stack may use two layers of adhesives having different elastic properties to improve mechanical impact resistance, with a first adhesive layer made of a viscoelastic material and a second adhesive layer having a low modulus of elasticity. The display stack may also include a hot melt protective sheet (HMPS) covering the display subassembly. The HMPS may be wrapped around the two side edges of a rigid substrate to attach directly to the substrate, thereby aiding in the adhesion of the display stack to the substrate. The display stack may also includes a patterned back protective sheet in which the protective backing layer is removed along the curved portions of the display stack.

20 Claims, 10 Drawing Sheets

(51) Int. Cl.
  *G02B 1/14*   (2015.01)
  *G02F 1/133*   (2006.01)
  *G02F 1/1333*   (2006.01)
  *G02F 1/1368*   (2006.01)
  *G06F 1/16*   (2006.01)
  *H01L 51/00*   (2006.01)

(56) References Cited

U.S. PATENT DOCUMENTS

| | | |
|---|---|---|
| 2010/0177259 A1 | 7/2010 | Ichioka et al. |
| 2014/0027044 A1 | 1/2014 | Kayal et al. |
| 2014/0043734 A1 | 2/2014 | Kim et al. |
| 2016/0093644 A1* | 3/2016 | Ki .................... H01L 29/78672 257/40 |

OTHER PUBLICATIONS

Author Unknown, "Display Modules," Available at: http://www.eink.com/modules.html, 3 pages, (printed Aug. 8, 2016).

Author Unknown, "Enhanced optical transparency," Available at: http://www.taica.co.jp/gel-english/products/use/index06.html, 3 pages, (printed Aug. 8, 2016).

Author Unknown, "Flexible Displays," Available at: http://www.eink.com/flexible.html, 3 pages, (printed Aug. 8, 2016).

* cited by examiner

BORDERLESS DISPLAY WITH CURVED EDGES

CROSS-REFERENCE TO RELATED APPLICATIONS

This application claims the benefit of U.S. Provisional Application No. 62/319,187, filed Apr. 6, 2016, the disclosure of which is incorporated herein by reference in its entirety.

BACKGROUND

Portable electronic devices, such as electronic book (e-book) readers or tablet computers, have become increasingly popular. The front side of a typical e-book reader includes a display portion for displaying e-books or other content, and a bezel region surrounding all four sides of the display portion. It is desired by some users to reduce the size of the bezel region in proportion to the size of the display portion, and, in particular, to reduce the width of the bezel on the lateral sides of the display portion. This can help to maximize the amount of viewable display size while minimizing the overall size of the device. However, the structure of the display stack for producing the images of the content limits the ways in which the bezel can be reduced in size. Accordingly, there is a need for improved electronic devices with improved displays.

DETAILED DESCRIPTION

Figure 1A:
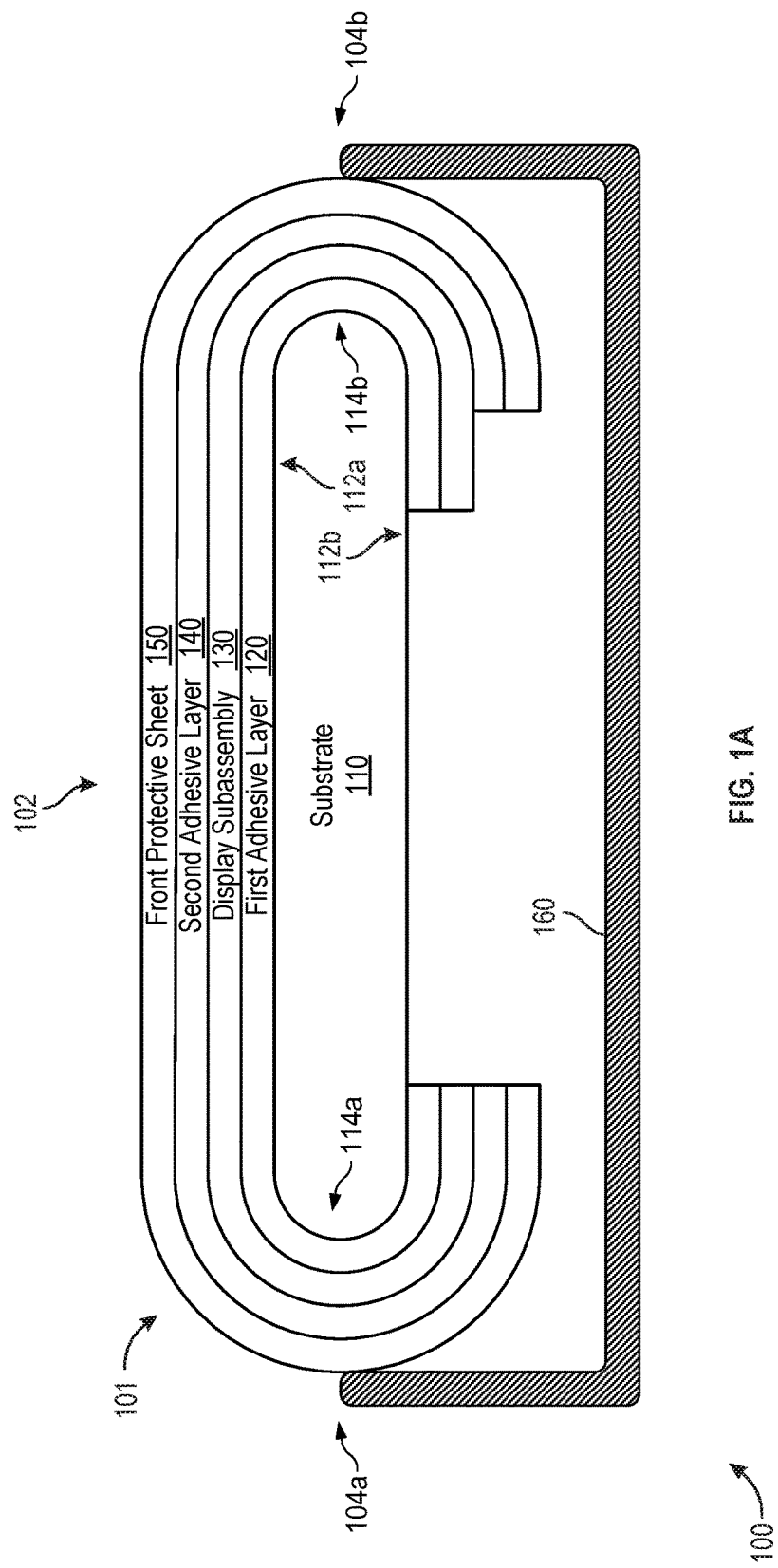
FIGS. 1A-1B are illustrative cross-sections of display stacks of an electronic device, in accordance with embodiments of the present invention.

In the following description, reference is made to the accompanying drawings, which illustrate several embodiments of the present disclosure. It is to be understood that other embodiments may be utilized, and system or process changes may be made without departing from the spirit and scope of the present disclosure. The following detailed description is not to be taken in a limiting sense, and the scope of the embodiments of the present invention is defined only by the claims of the issued patent. It is to be understood that drawings are not necessarily drawn to scale.

In accordance with aspects of the present invention, an electronic device, such as an e-book reader with an electrophoretic display (EPD) for rendering content, is provided. The device may have a display subassembly that wraps around two edges of a substrate so as to enable the display of content across the entire front side of the device. As a result, the device achieves a "borderless" display along two edges of the device (e.g., the left and right edges of the device when held in portrait mode) and a only small bezel along the remaining two edges (e.g., the top and bottom edges of the device when held in portrait mode).

In accordance with some embodiments, the display stack uses two layers of adhesives having different elastic properties to improve mechanical impact resistance. The first adhesive layer at the bottom of the display stack comprises a viscoelastic material which provides a more rigid support during fast mechanical impact but a softer support during slow mechanical bending. The second adhesive layer near the top of the display stack just below the front protective sheet comprises a material which can be easily stretched or deformed under mechanical impacts but still maintain its adhesion property to the display stack. The configuration can provide improved protection from mechanical impact for both the EPD ink capsules in the EPD module and the thin film transistor (TFT) backplane. This protection is particularly desirable in borderless display devices in which the display stack wraps around the edges of the device, because those edges are particularly vulnerable to mechanical impact.

In accordance with some embodiments, the display stack includes a front protective sheet (FPS) covering the display subassembly, which is wrapped around the two side edges of a rigid substrate. The FPS also wraps around those two side edges, but extends past the display subassembly and is directly attached to the substrate. The use of an FPS that extends past the display subassembly can prevent delamination of the display subassembly by providing an additional bonding force on top of the adhesive layer attaching the display subassembly to the substrate. This FPS may also provide improved edge sealing of the EPD capsules in the EPD module.

In accordance with some embodiments, the display subassembly includes a patterned protective backing layer such that the backing layer is not provided along the portions of the display stack which are wrapped around the edges of the substrate. The absence of the backing layer in these regions can ease the bending of the display stack around those edges of the substrate while still protecting other portions of the display stack, such as the portions of the TFT backplane on which the display driver integrated circuit is mounted.

Figure 2:
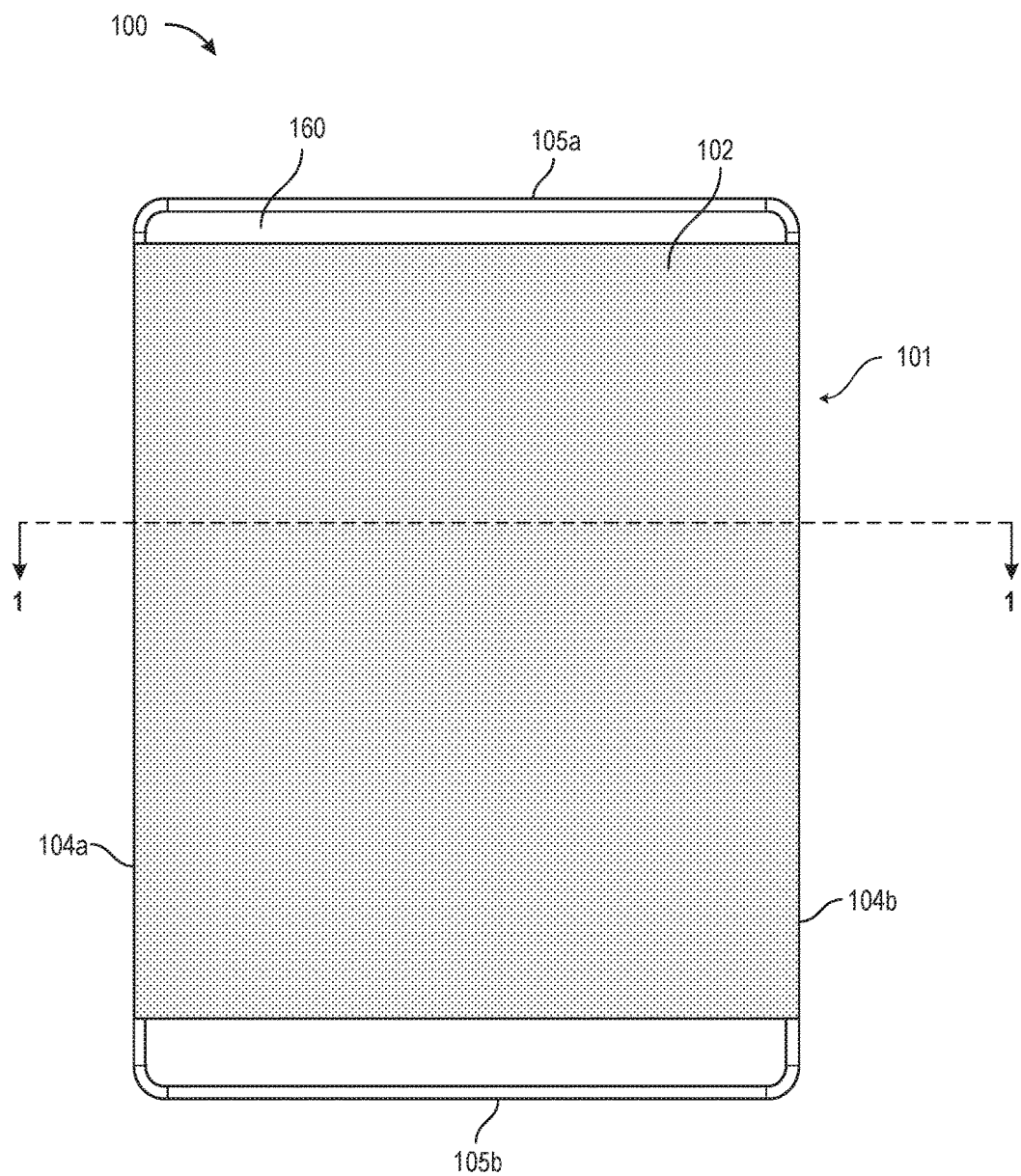
FIG. 2 is a front view of the device of FIG. 1A.

FIG. 1A is an illustrative cross section of a display stack 101 of an electronic device 100, such as an e-reader device, in accordance with embodiments of the present invention. FIG. 2 is an illustrative front view of the electronic device 100, with the cross section depicted in FIG. 1A being taken along line 1-1 of FIG. 2. The electronic device 100 may include a display area 102, which is configured to be driven or controlled to display content. In the electronic device 100 depicted in FIG. 2, the display area 102 of the display stack 101 only wraps around the side edges 104a-104b and does not extend all of the way to the top and bottom edges 105a-105b, thereby providing small bezel regions along the top and the bottom of the electronic device 100. It is to be understood that the display area 102 may be any desired size and could extend to and wrap around the top edge 105a and/or bottom edge 105b. It will be further understood that the cross section and other aspects of the drawings are not drawn to scale, with some features drawn larger relative to the other features for ease of illustration and reference. In addition, references to locations of the electronic device 100, such as top, bottom, left, right, front, and back are for illustrative purposes and are not to be considered limiting. In many embodiments, a device may be used in a variety of orientations, such as a "portrait" configuration in which the longer sides of the device are positioned along the left and right, and a "landscape" configuration in which the longer sides of the device are positioned along the top and bottom, as viewed by the user.

The display stack 101 includes a rigid substrate 110 having a first side 112a, an opposing second side 112b, and two curved edge portions 114a-114b which extend from the first side 112a of the substrate 110 to the second side 112b of the substrate 110. The substrate 110 may be made of any suitable material, such as, e.g., glass, polymer, or another rigid or semi-rigid material.

The display stack 101 includes a plurality of layers, including the substrate 110, a first adhesive layer 120, a flexible display subassembly 130, a second adhesive layer 140, and a front protective sheet (FPS) 150. A first adhesive layer 120, the flexible display subassembly 130, the second adhesive layer 140, and the FPS 150 are attached to the substrate 110 such that the side portions of the first adhesive layer 120, the flexible display subassembly 130, the second adhesive layer 140, and the FPS 150 wrap around the edge portions 114a-114b of the substrate 110 and are attached to the second side 112b of the substrate.

Figure 1B:
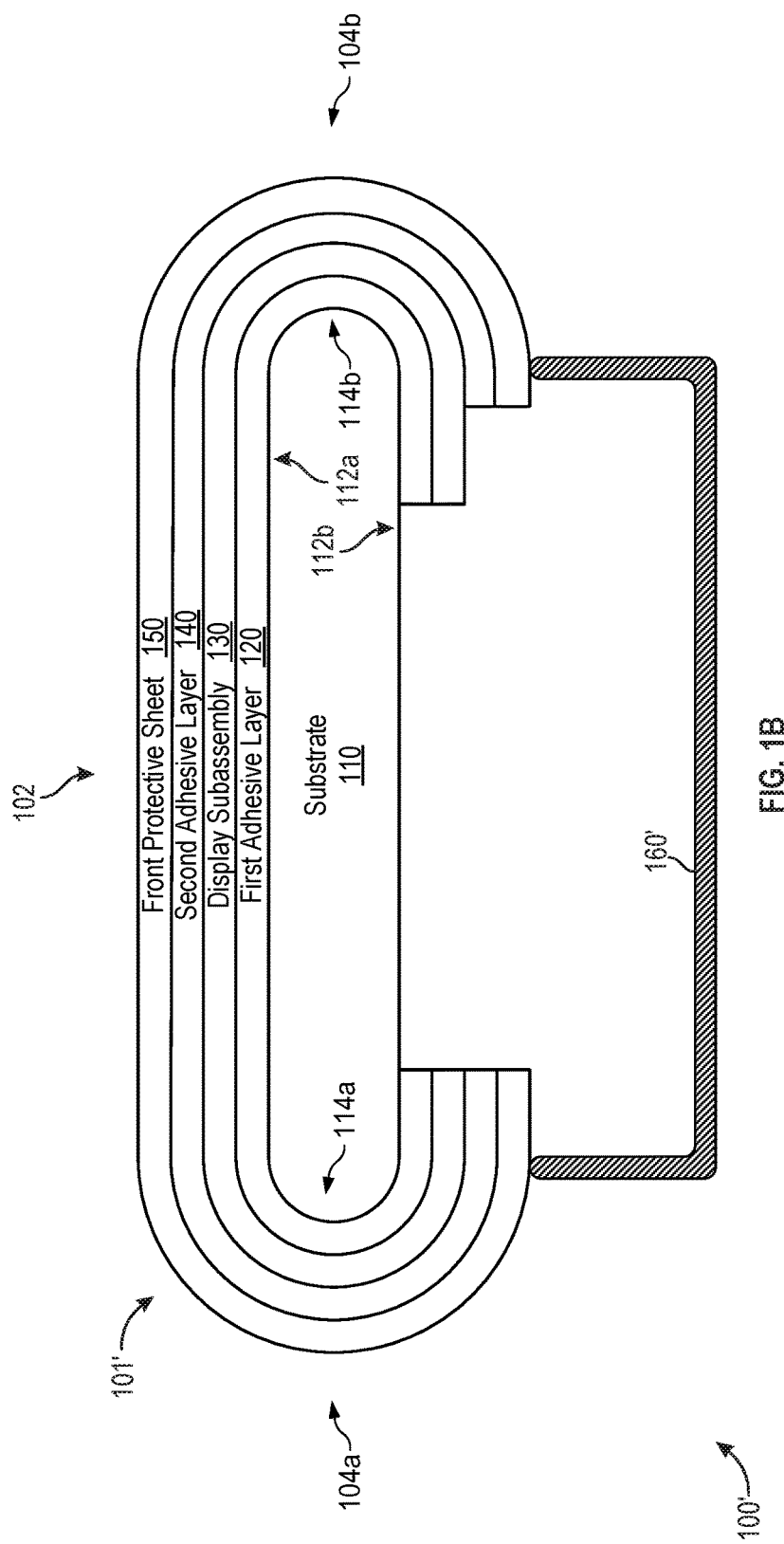

The display stack 101 may be coupled to a housing 160, which contains the various components of the device 100 (omitted from FIG. 1A for clarity). In FIG. 1A, the housing 160 is coupled to the close to the apex of the curved edge portions 104a-104b. FIG. 1B illustrates another embodiment of an electronic device 100' in which the housing 160' is coupled approximately at the end of the curved edge portions 104a-104b underneath the display stack 101'. It is to be understood that FIGS. 1A-1B are simplified illustrations and the various components and layers are not drawn to scale. In addition, in other embodiments, the display stack may be coupled to the housing at any desired location.

The displays of electronic devices are typically among the more fragile components of the devices, and can often be easily damaged when subjected to mechanical impact. Flexible EPD displays are particularly vulnerable to damage because the flexible layers of the display provide less rigid protection against impact. As a result, the EPD ink capsules contained in the display are subjected to a higher risk of rupture resulting from these impacts. Damage to the EPD ink capsules can cause local defects in the display, resulting in suboptimal performance and appearance. The individual pixels in the TFT backplane may be similarly damaged by mechanical impact. If a display subassembly 130 is rigidly supported, a mechanical impact will result in less impact strain and deformation of the layers of the display subassembly 130, but the lack of cushioning by the rigid support can cause a higher localized impact force on the display subassembly 130. As a result, the TFT backplane may be better protected, while exposing the EPD ink capsules to a greater risk of damage. Conversely, if a softer, more compliant support is used to support the display subassembly 130, the cushioning provided by the support may reduce localized impact forces but may result in a higher strain and deformation of the display subassembly 130. As a result, the EPD ink capsules may be better protected, while exposing the TFT backplane to a greater risk of damage.

This risk of damage exists for the planar display area 102 of the display stack 101, but is particularly acute for the edge portions 104a-104b of a device, as these edge portions 104a-104b are more likely to be exposed to localized impact when the device is dropped. Consequently, the risk of damage to the display stack is higher for devices having displays that extend all of the way to and/or around one or more edges of the device.

In accordance with embodiments of the present invention, a display stack 101 utilizing two or more adhesive layers having different mechanical properties is provided. The differing mechanical properties of these adhesive layers can improve mechanical impact resistance, particularly for electronic devices utilizing flexible displays extending to or around one or more side edges of the device.

In accordance with embodiments of the present invention, the first adhesive layer 120 provided between the display subassembly 130 and the substrate 110 comprises a viscoelastic material (sometimes referred to as a non-Newtonian fluid) that exhibits both viscous and elastic characteristics when undergoing deformation. Viscous materials resist shear flow and strain linearly with time when a stress is applied. Elastic materials strain when stretched and then return to their initial state after the force is removed. Viscoelastic materials have elements of both of these properties and, as such, exhibit time-dependent strain. When a viscoelastic material is subjected to a low shear rate (such as slow bending), the material behaves like a viscous material, like honey, resisting shear flow and straining linearly with time when a stress is applied. On the other hand, when a viscoelastic material is subjected to a high shear rate (such as what may occur when the device incorporating the material is dropped or subjected to a sudden impact), the material strains when stretched and quickly returns to its original state once the stress is removed.

In accordance with embodiments of the present invention, the first adhesive layer 120 is a viscoelastic material exhibiting the mechanical properties of a rigid material when subjected to a rapid mechanical impact, while exhibiting the mechanical properties of a soft, compressible material when subjected to slow mechanical pressure. In accordance with embodiments of the present invention, the first adhesive layer 120 may comprise, e.g., one or more of the following: a thermoplastic elastomer, a styrene-butadiene di-block copolymer, styrene-butadiene-styrene tri-block copolymer, cross-linked polyvinyl alcohol, cross-linked polyvinyl acetate, polydimethylsiloxane, polyurethane (e.g., "memory foam"), or an interpenetrating polymer network (IPN), which is a polymer comprising two or more networks that are at least partially interlaced on a polymer scale but not covalently bonded to each other.

In accordance with embodiments of the present invention, the second adhesive layer 140 provided above the display subassembly 130 comprises an optically clear adhesive (OCA) having a low modulus of elasticity and good shearing properties. The second adhesive layer 140 may comprise a material that is capable of dissipating mechanical energy (or absorbing mechanical impact energy) such that when an object falls onto this material, the material converts the kinetic energy of the shock into another form of energy (typically heat), which is then dissipated. The deposition of the second adhesive layer 140 on top of the display subassembly 130 may allow to the display to sustain a higher mechanical impact force (such as a ball drop) without damage to the functional layers in the display module, such as the TFT backplane and EPD capsules. In accordance with embodiments of the present invention, the second adhesive layer 140 may comprise, e.g., a polymeric material with a low modulus, such as a polymer having a long molecular chain length with a very low cross-linking density or no cross-linking at all, polybutadiene, a silicone optically clear adhesive, or a gel-type adhesive, such as polydimethylsiloxane with a low cross-linking density. In accordance with embodiments of the present invention, the second adhesive layer 140 comprises a material having a low modulus of elasticity between about 100 Pa to about 10 MPa.

Unlike conventional designs, the combination of two adhesive layers 120, 140 having different material properties can provide mechanical impact protection for both the EPD ink capsules as well as the TFT backplane. In particular, the two adhesive layers 120, 140 may deform during impact, so as to reduce the amount of stress applied to the more fragile EPD ink capsules and TFT backplane.

Figure 3:
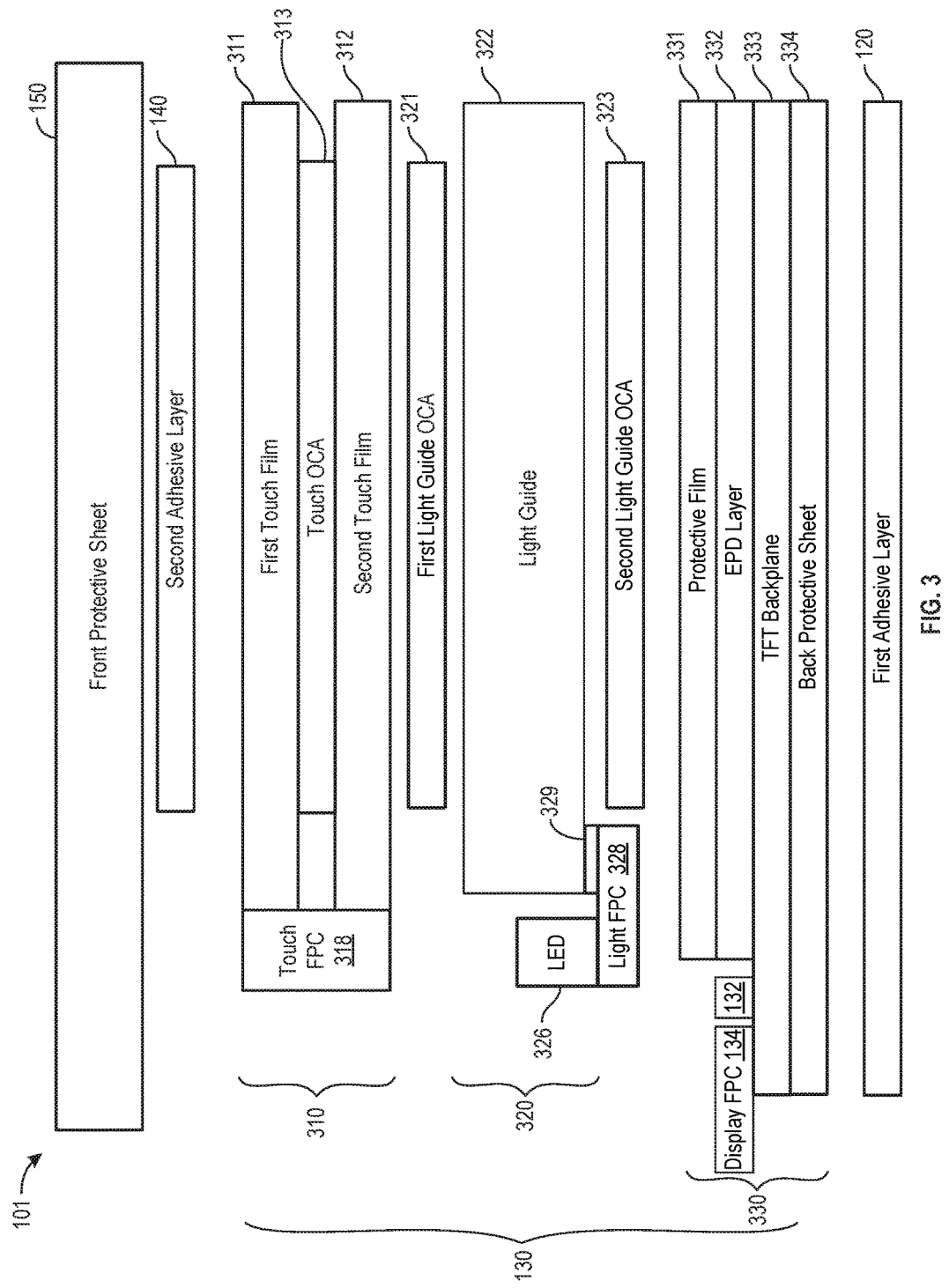
FIG. 3 is an exploded cross-section of a display stack, in accordance with embodiments of the present invention.

Embodiments of the present invention may be used in conjunction with any of a variety of display designs. FIG. 3 is an exploded cross-section of a display stack 101, in accordance with embodiments of the present invention. In the embodiment shown, the display stack 101 is part of an illuminated touch-sensitive e-reader device, and the display subassembly 130 includes a touch subassembly 310, a light subassembly 320, and a display module 330.

The touch subassembly 310 may receive touch inputs related to displayed content, such as a touch input to turn the page of an electronic book. Touch subassembly 310 may comprise multiple layers. In the illustrated embodiment, the touch subassembly 310 comprises a first touch film 311, a second touch film 312, and a touch FPC 318. The first touch film 311 may be adhered to the FPS 150 via the second adhesive layer 140. The second touch film 312 may be adhered to the first touch film 311 via a touch OCA layer 313. The touch films 311-312 may comprise, e.g., a PET material. The touch FPC 318 can provide electrical connectivity of various electronic components on the touch FPC 318 (e.g., the display driver circuit 132 for the display module 330) with other components of the device 100, and may be operatively coupled with a display FPC 134. In some embodiments, the touch films 311-312 may comprise patterns made from indium tin oxide (ITO), copper, printed ink or the like, and the patterns may form rows and columns. Such patterns may provide a grid of capacitors that may project an electric field through the FPS 150, and the capacitance of one or more capacitors may be changed by the placement of a finger near the FPS 150. The patterns may be coupled to signal lines or traces along the outer edge or border of the touch subassembly 310. It is to be understood that the number of touch films of the touch subassembly 310 is not meant to be limiting, and any number of touch films may be used, such as four touch films with each having conductive patterns formed thereon.

In the illustrated embodiment, the touch subassembly 310 is coupled to the FPS 150 via the second adhesive layer 140, as described above. The second adhesive layer 140 may possess mechanical characteristics different the first adhesive layer 120, as described above. The second adhesive layer 140 may be solid OCA or liquid OCA, and may comprise a material with ultraviolet (UV) cut capabilities. For example, the UV cut material may block, cut out, stabilize or absorb light with a wavelength of about 390 nm or lower. Such UV cut material may provide a UV filter for the purpose of protecting components lower in the display stack 101 from UV light that may be incident on the electronic device 100. For example, the UV cut material may cause the display subassembly 130 to have reduced discoloration, such as a yellowing discoloration, due to exposure to UV light. A UV cut material may comprise, for example, hindered amine light stabilizers (HALS) or the like, which may absorb UV light and dissipate such UV light into thermal energy.

Under some embodiments, instead of or in addition to the second adhesive layer 140 having UV cut capabilities, the touch subassembly 310 may have UV cut capabilities. For example, a coating of UV absorbing material may be applied to a top surface of the touch subassembly 310 or UV absorbing material may be integrated or embedded into the touch subassembly 310. For example, the touch subassembly may comprise a material such as polyethylene terephthalate (PET) or a low birefringence material such as a cyclic olefin polymer (COP), and UV cut material may be integrated into such material of the touch subassembly 310.

In touch-sensitive devices, a user may cause the device 100 to perform an action by interacting with the touch subassembly 310. For example, an action may be turning the page of an electronic book. Interacting with the touch subassembly 310 may comprise applying a touch or multiple touches to the display area 102 of the display stack 101. In some embodiments, the touch subassembly 310 may be capable of detecting touches as well as determining an amount of pressure or force of those touches. A touch subassembly 310 may comprise a capacitance touch sensitive sensor, an infrared touch screen sensor, a force sensitive resistance sensor, or other touch-sensing technology.

The light subassembly 320 may be adhered to the touch subassembly 310 via a first light guide OCA layer 321. In the illustrated embodiment, the light subassembly 320 comprises a light guide 322, which may be adhered to the second touch film 312 via the first light guide OCA layer 321. The light subassembly 320 may comprise one or more light sources 326, such as light emitting diode light sources (LEDs), provided along an edge of the light subassembly 320. As shown, the light subassembly 320 may also comprise a light FPC 328 having a light connector (not shown) for coupling with the display FPC 134. The light FPC 328 may be coupled to the light guide 322 using, for example, an adhesive layer 329. The light subassembly 320 may be coupled to the touch subassembly 310 via a first light guide OCA layer 321 or other optically clear bonding. The first light guide OCA layer 321 may be solid OCA or liquid OCA, and may comprise a material such as silicone, acrylic, or the like.

The display subassembly 130 depicted in FIG. 1A comprises an EPD module 330 comprising a laminate of multiple layers used to generate the images displayed by the display subassembly 130. In the illustrated embodiment, the EPD module 330 comprises an EPD layer 332 containing EPD ink capsules that are driven by the TFT backplane 333 to produce various levels of white, black, gray, and/or colors. The light guide 322 directs light from the light sources 326 across the viewing surface of the EPD module 330. For example, directing light across the EPD module 330 may enhance the visibility of displayed content by enhancing the contrast of the displayed content. Under some embodiments, the light guide 322 may comprise a light guide panel having a pattern of optical surface features formed thereon, for directing light from the light sources 326 across the EPD module 330, thus illuminating the EPD module 330. The light guide 322 may comprise a polycarbonate material, polymethyl methacrylate ("PMMA") material, or the like. The optical surface features may comprise diffusers, grooves, grating, dimples, lenses, planar surfaces, concave surfaces, convex surfaces, and so forth, which may be used to enhance or attenuate the transmission or dispersion of light from the light sources 326 and through the light guide 322. The light guide 322 may have any suitable thickness, such as, e.g., no greater than about 2 mm, no greater than about 1.5 mm, no greater than about 1 mm, no greater than about 0.5 mm, no greater than about 0.25 mm, no greater than about 0.2 mm, or no greater than about 0.1 mm.

The display subassembly 130 may utilize any type of display technology suitable for the desired application. In the embodiment illustrated in FIG. 1A, the display subassembly 130 utilizes an EPD module 330, but in other embodiments, different types of display subassemblies may be used, such as, for example, an electrowetting display, electrofluidic display, interferometric modulator display, and/or any other type of bi-stable display. Alternatively, the display subassembly 130 may comprise another type of device capable of rendering visible images, such as, e.g., liquid crystal display (LCD) screens, gas plasma-based flat panel displays, LCD projectors, etc. Though not shown, in some embodiments, the display subassembly 130 may be coupled to a corresponding display controller contained in the housing 160 of the device 100.

The EPD module 330 may further comprise a display FPC 134. The display FPC 134 may comprise a touch socket and a light socket, with each positioned on opposing ends of the display FPC 134 along a side of the EPD module 330. It is to be understood that the position of the touch socket may correspond to the position of the touch connector of the touch FPC 318, and the position of the light socketmay correspond to the position of the light connector of the light FPC 328. Under some embodiments, the touch socket, light socket, and corresponding touch and light connectors may couple via board-to-board coupling. Under other embodiments, the touch and light connectors may be respectively bonded to the touch and light sockets with, e.g., anisotropic conductive film (ACF).

In some embodiments, the display subassembly 130 may comprise an electrophoretic display that moves EPD particles between different positions to achieve different color shades. For instance, with a pixel that is free from a color filter, the pixel may be configured to produce white when the particles within this pixel are located at the front (e.g., viewing) side of the display. When situated in this manner, the particles reflect incident light, thus giving the appearance of a white pixel. Conversely, when the particles are located near the rear of the display, the particles absorb the incident light and, hence, cause the pixel to appear black to a viewing user. In addition, particles may situate at varying locations between the front and rear sides of the display to produce varying shades of gray. Furthermore, as used herein, a "white" pixel may comprise any shade of white or off-white, while a "black" pixel may similarly comprise any shade of black.

In other embodiments, the EPD module 330 may comprise an electrophoretic display that includes oppositely charged light and dark particles. In order to render white, the display controller moves the light particles to the front side of the display by creating a corresponding charge at an electrode near the front and moves the dark particles to the back of the display by creating a corresponding charge at an electrode near the back. In order to render black, the display controller changes the polarities and moves the dark particles to the front and the light particles to the back. Furthermore, to create varying shades of gray, the display controller may utilize different arrays of both light and dark particles. It is to be understood that while some of the examples described above are discussed as rendering black, white, and varying shades of gray, it is to be appreciated that the described techniques apply equally to reflective displays capable of rendering color pixels.

In the embodiment shown in FIG. 3, the EPD module 330 is coupled to the light subassembly 320 via a second light guide OCA layer 323 or other optical bonding. The second light guide OCA layer 323 may be solid OCA or liquid OCA, and may comprise a material such as silicone, acrylic, or the like. In the illustrated embodiment, the EPD module 330 includes a TFT backplane 333 may be made of any suitable flexible material, such as, e.g., polysilicon (PS), polyamide (PA), polyimide (PI), polyethylene terephthalate (PET), polyethersulfone (PES), polycarbonate (PC), and the like. The TFT backplane 333 may be flexible such that the TFT backplane 333 may be capable of bending around the edges 112a-112b of the substrate 110 during manufacturing. The substrate 110 may support the TFT backplane 333 in such a way as to prevent the TFT backplane 333 from bending or flexing beyond an amount at which shattering or breakage may occur. The display FPC 134 may be adhered to the TFT backplane 333 using, e.g., an anisotropic conductive film (ACF).

In some embodiments, a protective backing layer 334 is coupled to the TFT backplane 333 using, for example, a pressure sensitive adhesive (PSA). The BPL 334 may comprise a PET material and may support the TFT backplane 333 in such a way as to prevent the TFT backplane 333 from bending or flexing beyond an amount at which breakage may occur. The BPL 334 may protect the TFT backplane 333 from scratches, fractures, chips, or other damage.

The EPD layer 332 may be adhered to the TFT backplane 333. It is to be understood that the EPD layer 332 may comprise a laminate as is commonly known in the art for EPD displays. In some embodiments, the EPD layer 332 may comprise microcapsules having charged pigment or particles suspended within a dielectric solvent (e.g., a high dielectric, low viscosity suspending medium). The charged particles may be of different colors (e.g., a combination of white, black, and/or colored particles). White particles and color particles, or white particles and black particles, may move within the dielectric solvent in response to an electric field applied thereto by the TFT backplane 333. For a mono type display module 330, which generates black and white images on the display, the EPD layer 332 may contain white and black particles. For a display module 330 configured to generate colored images, the EPD layer 332 may contain white and colored particles. In some embodiments, the EPD layer 332 may have a thickness that is no greater than about 400 microns, no greater than about 350 microns, no greater than about 300 microns, no greater than about 300 microns, no greater than about 250 microns, no greater than about 200 microns, no greater than about 150 microns, no greater than about 120 microns, no greater than about 100 microns, no greater than about 80 microns, or no greater than about 60 microns. The EPD layer 332 and/or the TFT backplane 333 may also comprise top and bottom electrodes, which may be operatively coupled to the display FPC 134. Such top and bottom electrodes may apply a positive or negative electric field such that corresponding particles move to the top of the microcapsule where they become visible to the user. The protective film 331 may be adhered to the EPD layer via an optically clear adhesive. It is to be understood that although the protective film 331 is illustrated as a separate layer from the EPD layer 332, in some embodiments, the EPD layer 332 and the protective film 331 may be formed as a single component. The protective film 331 may comprise a PET material or the like.

The sizes of the various layers and structures may vary in different embodiments. In some embodiments, the FPS 150 may have a thickness of between about 50 μm to about 100 μm. The second adhesive layer 140 may have a thickness of between about 50 μm to about 150 μm. The first touch film 311 and the second touch film 312 may each have a thickness of about 100 μm, and the touch OCA layer 313 may have a thickness of about 50 μm. The first light guide OCA layer 321 may have a thickness of about 0.15 mm. The light guide 322 may have a thickness of about 400-500 μm. The second light guide OCA layer 323 may have a thickness of about 0.175 mm. The protective film 331 may have a thickness of about 116 μm, an optically clear adhesive between the protective film 331 and the EPD layer 332 may have a thickness of about 50 μm, the EPD layer 332 may have a thickness of about 170 μm, the TFT backplane 333 may have a thickness of about 10 μm. It is to be understood that the dimensions are for illustrative purposes, and other suitable dimensions may be utilized. It is to be further understood that a display stack 101 may comprise different layers than those schematically shown in FIGS. 1 and 3, and that those variations of layers are encompassed within the embodiments disclosed herein.

In the embodiment illustrated in FIGS. 1 and 3, the first adhesive layer 120 is provided between the substrate 110 and the TFT backplane 333, and the second adhesive layer 140 is provided between the FPS 150 and the touch subassembly 310. In other embodiments, the first and second adhesive layers 120, 140 may be provided in different locations. For example, in other embodiments, the viscoelastic first adhesive layer 120 may be positioned beneath the TFT backplane 333 to adhere the protective backing layer 334 to the TFT backplane 333. In addition, a second adhesive layer 140 having a low modulus of elasticity may be provided at any layer above the viscoelastic first adhesive layer 120, such as, e.g., between the touch subassembly 310 and the light subassembly 320 instead of the first light guide OCA 321, or between the light subassembly 320 and the EPD module 330 instead of the second light guide OCA 323. In other embodiments, the second adhesive layer 140 may be provided between the first and second touch films 311-312 instead of touch OCA 313.

In some embodiments, it may be desirable for EPD layer 332 to be positioned in the display stack 101 such that when the display stack 101 is wrapped around the substrate 110, the EPD layer 332 is located in or near the neutral axis of the bending region. As a result, when the display stack 101 is wrapped around the substrate 110, the layers below the EPD layer 332 (e.g., the layers between the EPD layer 332 and the substrate 110) are subjected to compressive forces, while the layers above the EPD layer 332 (e.g., the layers between the EPD layer 332 and the front face of the device 100) are subjected to tensile forces. With this configuration, the EPD layer 332, which is one of the more fragile and important layers in the stack 101 is subjected to the minimum amount of stress and strain when bent around the substrate 110. Any suitable radius of curvature for the EPD layer 332 may be used, such as, e.g., no greater than about 7 mm, no greater than about 5 mm, no greater than about 3 mm, or no greater than about 1 mm.

Front Protective Sheet Attachment

Figure 4A:
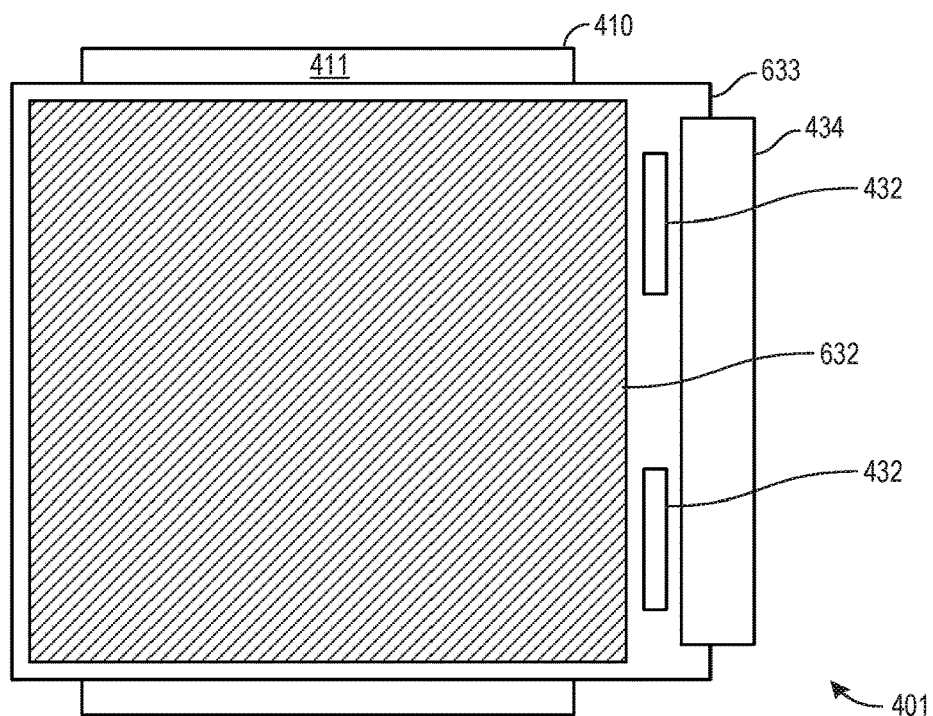
FIGS. 4A-4B are front views of a display stack in accordance with embodiments of the present invention.
Figure 4B:
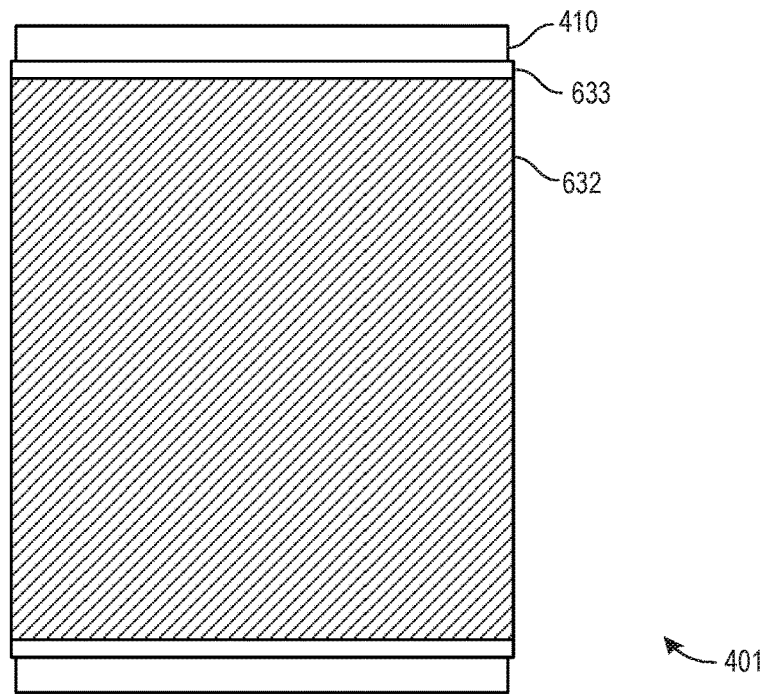
Figure 5A:
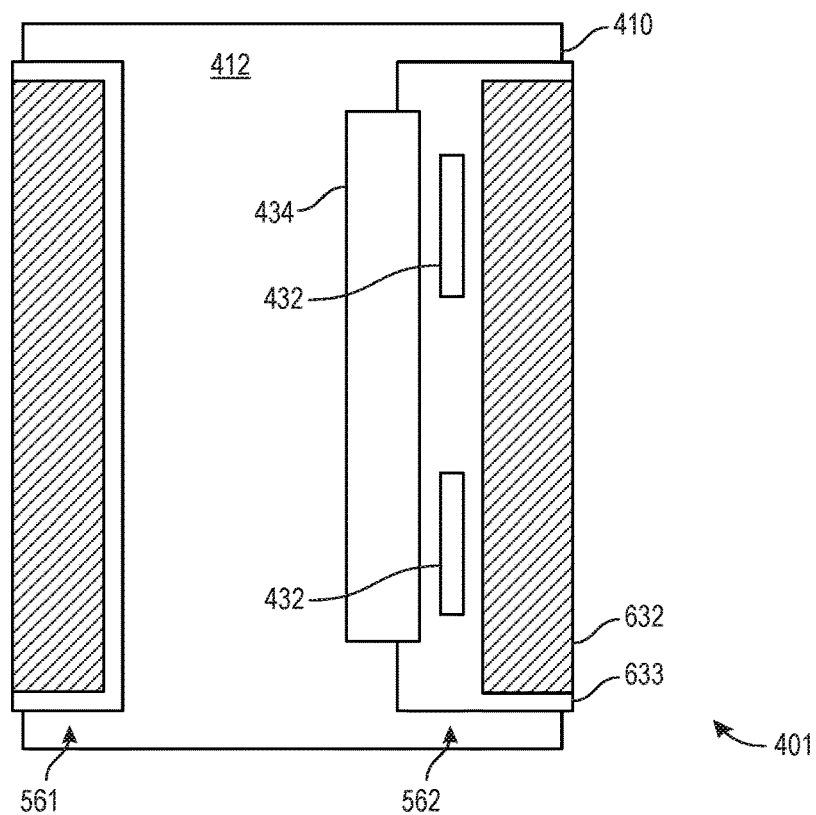
FIGS. 5A-5B are back views of a display stack in accordance with embodiments of the present invention.
Figure 5B:
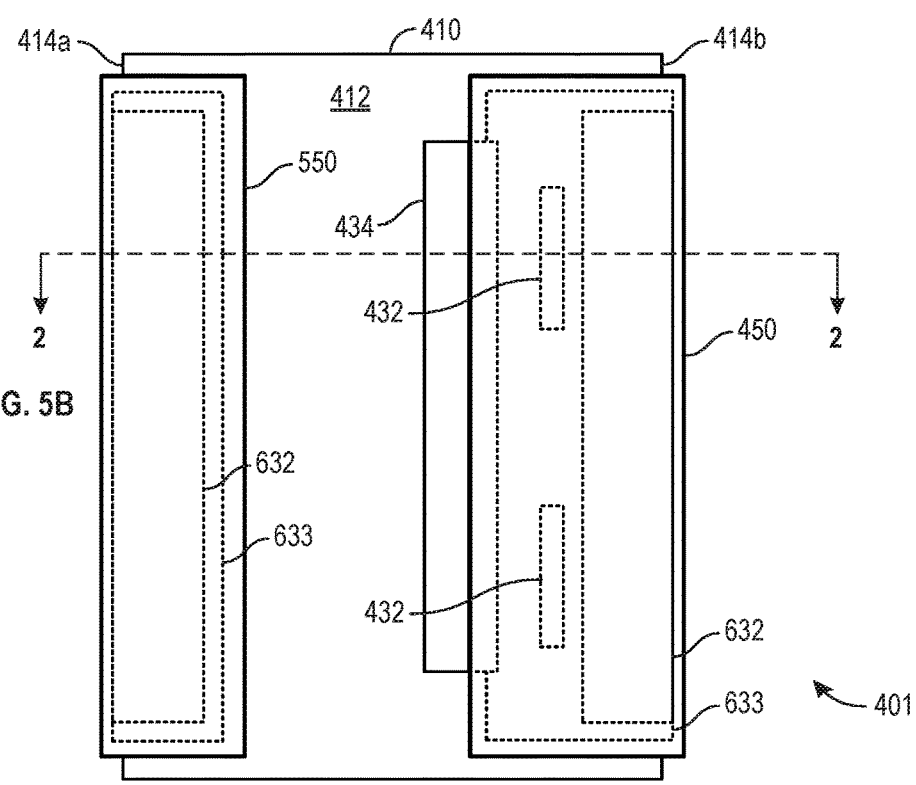
Figure 6:
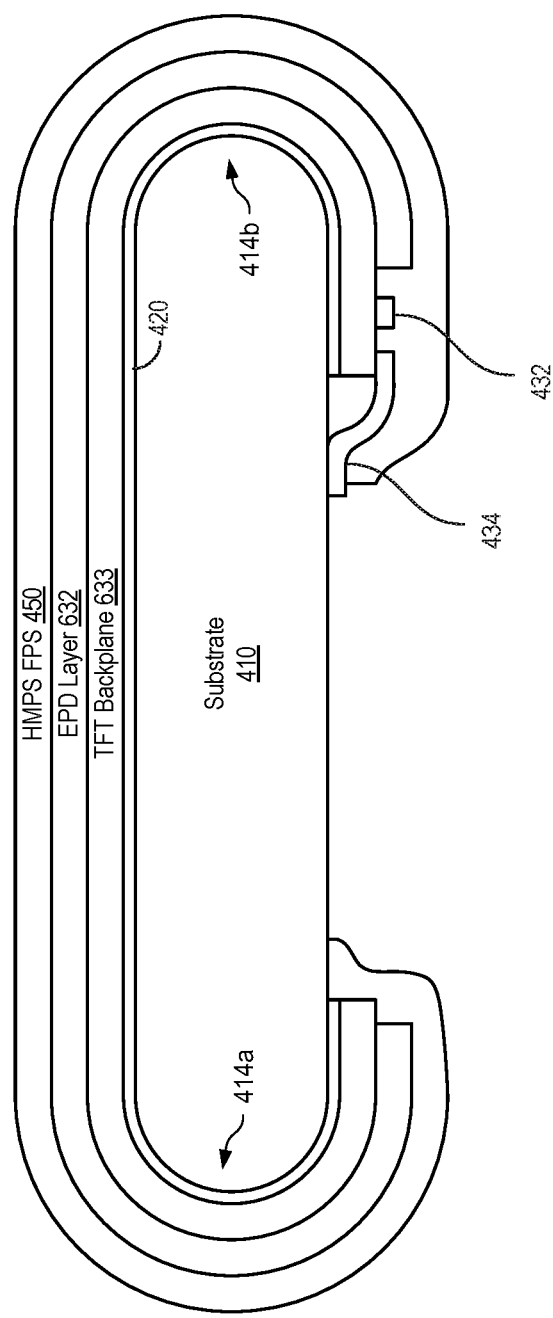
FIG. 6 is a cross-sectional view of the display stack of FIG. 5B.

In accordance with embodiments of the present invention, a display stack is provided in which the front protective sheet extends beyond the edge of the display subassembly and is directly attached to the underlying substrate. FIGS. 4A-4B are front views and FIGS. 5A-5B are back views of a display stack 401 in accordance with embodiments of the present invention. FIG. 6 is a cross-sectional view of the display stack 401 taken along the line 2-2 in FIG. 5B.

FIG. 4A illustrates a TFT backplane 633 coupled to an EPD layer 632 positioned above the first side 411 of a substrate 410 (e.g., the front side of the substrate 410), before the TFT backplane 633 and EPD layer 632 are wrapped around the substrate 410. FIG. 4B illustrates the display stack 401 after the TFT backplane 633 and EPD layer 632 are wrapped around the substrate 410.

As can be seen in the back view of the display stack 401 illustrated in FIG. 5A, a first end portion 561 and a second end portion 562 of the TFT backplane 633 extend around the edges of the substrate 410 and are coupled to the second side 412 of the substrate 410 (e.g., the back side of the substrate 410). In the illustrated embodiment, display driver circuits 432 and a display FPC 434 are positioned on the second end portion 562 of the TFT backplane 633. It is to be understood that the relative sizes of the various components, such as the first and second end portions 561-562, are exaggerated for clarity in the Figures.

Although the TFT backplane 633 may be attached to the substrate 410 using an adhesive layer 420 (shown in FIG. 6), this adhesive layer 420 may not provide a sufficient bonding force between the TFT backplane 633 and the substrate 410 to prevent separation of the TFT backplane 633 and the substrate 410 as the device is subjected to mechanical stress over time. In accordance with embodiments of the present invention, the FPS 450 is used to provide both impact protection for the underlying display subassembly as well as to provide an additional bonding force with the substrate 410. This can be accomplished by forming the FPS 450 over the display subassembly (e.g., the TFT backplane 633 and EPD layer 632) and beyond one or more edges of the display subassembly so that the FPS 450 can be directly attached to the substrate 410.

The FPS 450 can be made of any suitable material. In some embodiments, the FPS 450 comprises a transparent hot melt protective sheet (HMPS) which softens when heated, and can then be applied over the TFT backplane 633 and EPD layer 632 using, e.g., a slot-die coating system. The FPS 450 may comprise a core material, such as, e.g., PET, PMMA, polycarbonate (PC), polyethylene succinate (PES), polyethylene naphthalate (PEN), or polyimide (PI), with a heat-activated adhesive coated on one side of the core material. The heat-activated adhesive may comprise, e.g., a base material with one or more additives. The composition may be formulated to have a glass transition temperature below the lowest service temperature and a suitably high melt temperature. Examples of the adhesives for the HMPS FPS 450 include ethylene-vinyl acetate (EVA) copolymers, polyolefins, polybutene-1, polyamides, polyesters, and polyurethane. In accordance with embodiments of the present invention, the FPS 450 comprises a HMPS having a glass transition temperature of between about 80° C. to about 130° C.

In the embodiment illustrated in FIG. 5B, the HMPS FPS 450 is applied so as to have a surface area larger than the TFT backplane 633 and EPD layer 632, thereby overlying the entire TFT backplane 633 and EPD layer 632. As a result, the HMPS FPS 450 is directly attached to the substrate 410 around the entirety of the edge of the TFT backplane 633. This can provide an additional bonding force along all edges between the display subassembly and the substrate 410. In addition, the HMPS FPS 450 can also serve as an edge seal material for the EPD layer 632, to provide an improved moisture barrier for the active material within the EPD layer 632.

In some embodiments, the FPS 450 may extend beyond only a portion of the TFT backplane 633, e.g., one, two, or three edges of the TFT backplane 633, or only portions of the edges of the TFT backplane 633, such that the FPS 450 is only directly attached to the substrate 410 at certain regions. This may be desirable to reduce the size of the FPS 450, while providing additional bonding force to targeted regions, e.g., regions where the display subassembly is most likely to separate from the substrate 410 during use or manufacturing. For example, in some embodiments, the FPS 450 extends beyond the edge of the TFT backplane 633 at the curved edge portions 414a-414b of the substrate 410 and/or the back side 412 of the substrate 410. In some embodiments, an additional protective cover layer may be provided, such as a cover glass layer, may be provided on top of the FPS 450. In these embodiments, the FPS 450 may be used primarily for its additional adhesive bonding characteristics, while the cover glass layer may be used to supplement or replace the impact protection provided by the FPS 450 in other embodiments where no cover glass is used.

Patterned Protective Backing Layer

Figure 7:
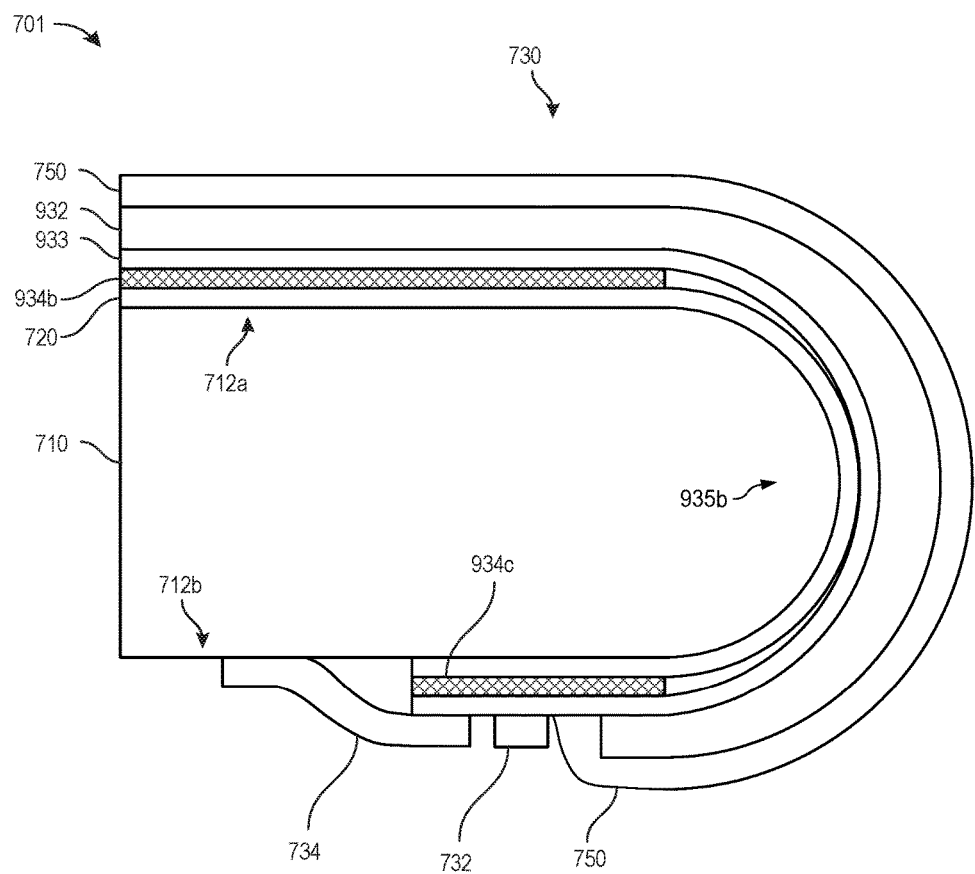
FIG. 7 is a partial cross-sectional view of a display stack having a display subassembly with a patterned protective backing layer in accordance with embodiments of the present invention.
Figure 8A:
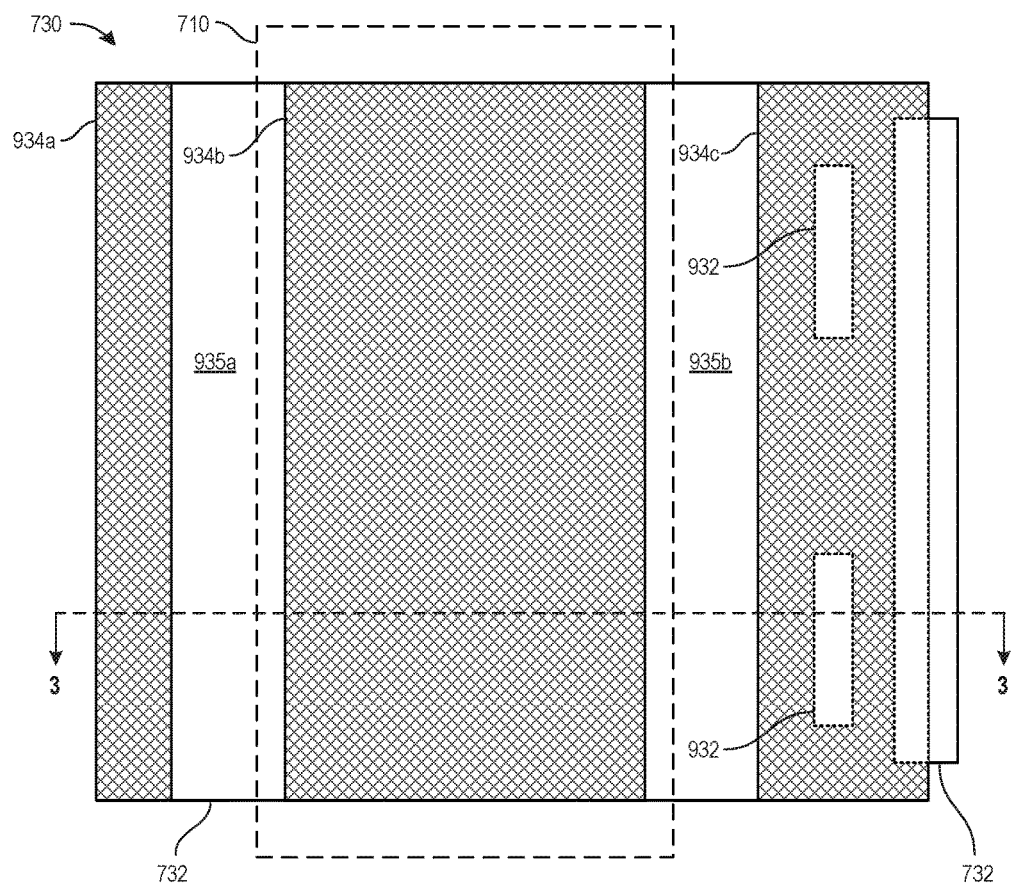
FIGS. 8A-8B are back and cross-sectional views, respectively, of the display subassembly of FIG. 7.

FIG. 7 is a partial cross-sectional view of a display stack 701 having a display subassembly 730 with a patterned protective backing layer, in accordance with embodiments of the present invention. FIG. 8A is a back view of the display subassembly 730, and FIG. 8B is a cross-sectional view of the display subassembly 730 taken along line 3-3 in FIG. 8A.

As described above with respect to FIG. 3, in some embodiments, the EPD module may include a backing layer to provide protection for the TFT backplane. In accordance with some embodiments of the present invention, the EPD module 930 of a display stack 701 may include a backing layer 934 which is selectively patterned so as to provide protection for regions of the TFT backplane 933 where the backing layer 934 is provided, while facilitating easier bending of the EPD module 930 in regions where the backing layer 934 is not provided.

Figure 8B:
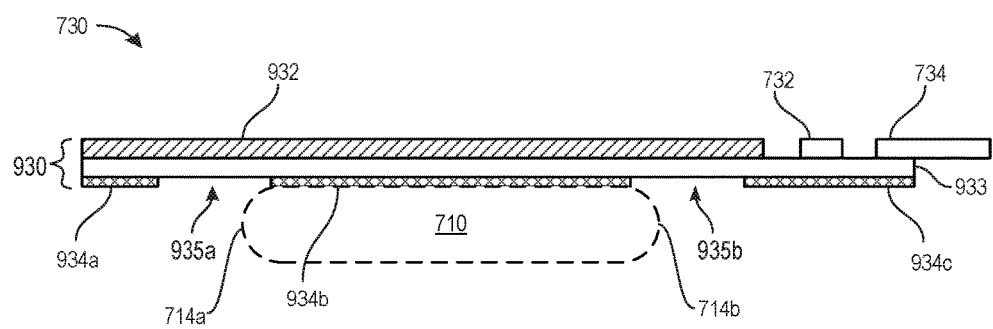

In the embodiment shown in FIGS. 7, 8A, and 8B, the backing layer 934 is patterned so as to be provided in three backing layer regions 934a-934c separated by openings 935a-935b provided therebetween. FIGS. 8A-8B show in dotted line the location where the substrate 710 will be positioned before wrapping the display subassembly 730 around the substrate 710. FIG. 7 shows the second edge portion 714b of the substrate 710 with the display subassembly 730 coupled to and wrapped around the substrate 710.

The backing layer regions 934a-934c may be made of, for example, a polymeric sheet such as polyester (PES), polyethylene terephthalate (PET), polyethylene (PE), high-density polyethylene (HDPE), low-density polyethylene (LDPE), polypropylene (PP), polyamides (PA) (nylons), or polyurethanes (PU). The thickness of the BPS can be in the range of about 0.1 mm to about 1.0 mm. In this embodiment, the central backing layer region 934b is attached to the first (e.g., front) side 712a of the substrate 710 with an adhesive layer 720. Although the central backing layer region 934b ends before the second edge portion 714b of the substrate 710, the TFT backplane 933 and EPD layer 932 extend beyond the end of the central backing layer region 934b to wrap around the second edge portion 714b. Because no backing layer 934 is provided in the opening 935b, the opening 935b (which contains the flexible TFT backplane 933 and EPD layer 932) can be more easily wrapped around the second edge portion 714b. The portion of the display subassembly 730 beyond the curved edge portion 714b is coupled to the planar second side 712b of the substrate 710. As a result, the planar backing layer region 934c may be provided along this portion to be attached to the second side 712b of the substrate 710 via the adhesive layer 720. This backing layer region 934c may advantageously provide structural support and protection for components provided in or on the TFT backplane 933, such as the display FPC 734, display driver circuits 732, and any interconnects provided in the TFT backplane 933, e.g., fanout interconnect lines coupling the display driver circuit 732 with the signal lines across the surface of the TFT backplane 933.

In the illustrated embodiment, the other side of the display subassembly 730 is wrapped around and extends beyond the first edge portion 714a of the substrate 710. Another backing layer region 934a may be provided on this portion of the display subassembly 730 that extends beyond the curved edge portion 714a and is coupled to the second side 712b of the substrate 710.

Either before or after the display subassembly 730 is wrapped around and attached to the substrate 710, a FPS 750 may be formed on top of the EPD layer 932. This FPS 750 may be similar to FPS 150 or FPS 550 described above with respect to FIGS. 1 and 6, respectively. In some embodiments, the FPS 750 may extend beyond the edges of the TFT backplane 933 and be attached directly to the substrate 710, similar to FPS 550. In other embodiments, the FPS 750 may only extend partially over the surface of the TFT backplane 933, e.g., to encapsulate only EPD layer 932, leaving a portion of the TFT backplane 933 uncovered by the FPS 750, as shown in FIG. 7.

Although the embodiment illustrated in FIGS. 7 and 8A-8B show three separate backing layer regions 934a-934c, in other embodiments, the backing layer may be provided in any desired pattern. For example, in some embodiments, One or two of the backing layer regions 934a-934c may be omitted. This may be desirable to reduce the overall thickness of the display stack 701, while still providing protection for selected portions of the display subassembly 730, e.g., the portion(s) of the TFT backplane 933 containing fragile interconnects, circuits, or components.

In other embodiments, the backing layer may not be entirely removed in the curved regions, but instead be thinned or reduced in size so as to provide less bending resistance than would exist if the backing layer was continuous across the surface of the TFT backplane.

Figure 9:
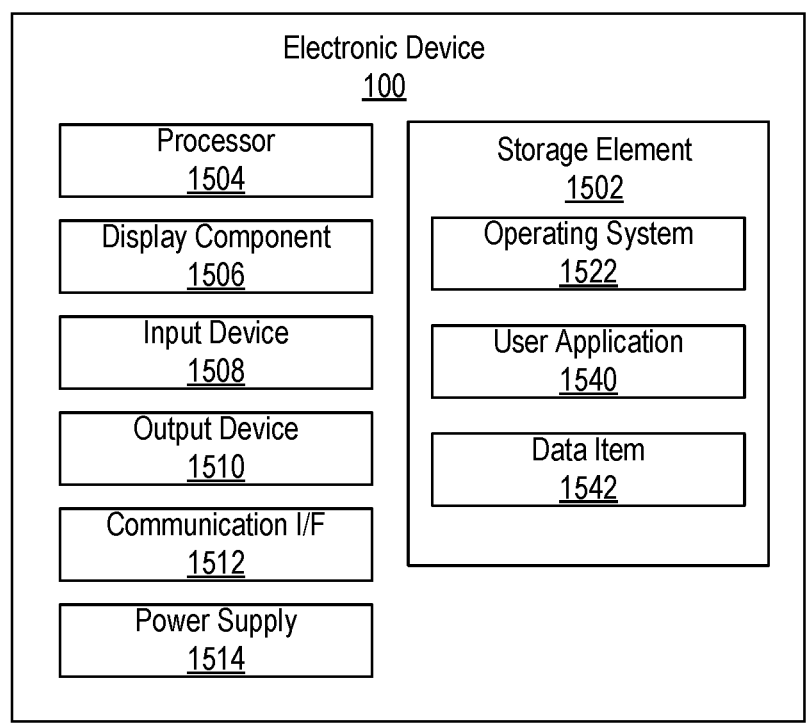
FIG. 9 illustrates an example block diagram of an electronic device, in accordance with embodiments of the present invention.

FIG. 9 illustrates an example block diagram of an electronic device 100, in accordance with embodiments of the present invention. The electronic device 100 may be implemented as any of a number of electronic devices, such as an e-book reader, a tablet computing device, a smartphone, a media player, a portable gaming device, a portable digital assistant, a laptop computer, a desktop computer, and other devices providing media presentation functionality. It should be understood that various types of computing devices including a processor, a memory, and a user interface for receiving user input can be used in accordance with various embodiments discussed herein.

The electronic device 100 may include a display component 1506. The display component 1506 may comprise, for example, one of the display stacks described herein. The electronic device 100 may include one or more input devices 1508 operable to receive inputs from a user. The input devices 1508 can include, for example, a push button, touch pad, touch screen, wheel, joystick, keyboard, mouse, trackball, keypad, accelerometer, light gun, game controller, or any other such device or element whereby a user can provide inputs to the electronic device 100. These input devices 1508 may be incorporated into the electronic device 100 or operably coupled to the electronic device 100 via wired or wireless interface. For computing devices with touch sensitive displays, the input devices 1508 can include a touch sensor that operates in conjunction with the display component 1506 to permit users to interact with the image displayed by the display component 1506 using touch inputs (e.g., with a finger or stylus). The electronic device 100 may also include an output device 1510, such as one or more audio speakers.

The electronic device 100 may also include at least one communication interface 1512 comprising one or more wireless components operable to communicate with one or more separate devices within a communication range of the particular wireless protocol. The wireless protocol can be any appropriate protocol used to enable devices to communicate wirelessly, such as Bluetooth, cellular, IEEE 802.11, or infrared communications protocols, such as an IrDA-compliant protocol. It should be understood that the electronic device 100 may also include one or more wired communications interfaces for coupling and communicating with other devices, such as a USB port. The electronic device 100 may also include a power supply 1514, such as, for example, a rechargeable battery operable to be recharged through conventional plug-in approaches, or through other approaches such as capacitive charging.

The electronic device 100 may also include a processor 1504 for executing instructions and retrieving data stored in a storage element 1502 or memory. As would be apparent to one of ordinary skill in the art, the storage element 1502 can include one or more different types of non-transitory memory, data storage, or computer-readable storage media, such as, for example, a first data storage for program instructions for execution by the processor 1504, and a second data storage for images or data and/or a removable storage for transferring data to other devices. The storage element 1502 may store software for execution by the processor 1504, such as, for example, operating system software 1522 and user applications 1540. The storage element 1502 may also store a data item 1542, such as, for example, data files corresponding to one or more applications 1540.

Embodiments of the present invention may provide various advantages not provided by prior art systems. They can enable the use of displays which extend to and/or around one or more edges of the device, thereby reducing the size of the bezel of the device, by facilitating the wrapping of a flexible display stack around a rigid substrate. These embodiments can provide improved protection against mechanical impact damage, prevent decoupling of the display stack from the substrate by providing improved adhesion of the display stack to the substrate using an overlying FPS, and facilitate the bending of the display stack around the substrate while providing increased protection for certain regions of the display stack by using a patterned protective backing layer. Although these embodiments have been described in separate figures and examples, it is to be understood that various embodiments may utilize any combination of features, characteristics, and designs described herein.

While the invention has been described in terms of particular embodiments and illustrative figures, those of ordinary skill in the art will recognize that the invention is not limited to the embodiments or figures described. Many of the embodiments described above in relation to an e-book reader may be applied to a variety of electronic devices. Although various components of embodiments of the electronic device are described herein, one of ordinary skill in the art will understand that different or additional components may be used in order to construct a complete electronic device, including, e.g., control electronics, processors, circuit boards, etc. These components are well-known in the art and are not described in detail herein.

Although various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and, consequently, are not described in detail herein. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system. If embodied in hardware, each block may represent a circuit or a number of interconnected circuits to implement the specified logical function(s).

Although the processes, flowcharts, and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is to be understood that all such variations are within the scope of the present disclosure.

Also, any logic or application described herein that comprises software or code can be embodied in any non-transitory computer-readable medium for use by or in connection with an instruction execution system such as a processor in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. An electronic device comprising:
a substrate having a first side, an opposing second side, and a first curved edge portion;
a first adhesive layer coupled to the first side, extending around the first curved edge portion, and coupled to the second side, wherein the first adhesive layer comprises a viscoelastic material;
a flexible display subassembly coupled to the substrate by the first adhesive layer such that the display subassembly overlies the first side, extends around the first curved edge portion, and overlies the second side;
a second adhesive layer coupled to the display subassembly, the second adhesive layer being an optically clear adhesive having a modulus of elasticity of between about 100 Pa to about 10 MPa; and
a front protective sheet coupled to the display subassembly by the second adhesive layer such that the front protective sheet overlies the first side, extends around the first curved edge portion, and overlies the second side.

2. The electronic device of claim 1, wherein:
the first adhesive layer comprises one or more of the following: a thermoplastic elastomer, a styrene-butadiene block copolymer, or a interpenetration network polymer.

3. The electronic device of claim 1, wherein:
the second adhesive layer comprises one or more of a polybutadiene or a silicone optically clear adhesive.

4. The electronic device of claim 1, wherein:
the substrate further comprises a second curved edge portion opposite the first curved edge portion, the second curved edge portion extending from the first side to the second side;
the first adhesive layer extends around the second curved edge portion of the substrate;
the flexible display subassembly extends around the second curved edge portion of the substrate; and
the front protective sheet includes a portion that extends around the second curved edge portion of the substrate.

5. The electronic device of claim 1, wherein:
the front protective sheet includes a first portion that extends beyond a portion of the flexible display subassembly that overlies the second side of the substrate, wherein the first portion of the front protective sheet is directly attached to the second side of the substrate.

6. The electronic device of claim 1, wherein:
the front protective sheet comprises a transparent hot melt protective sheet.

7. The electronic device of claim 1, further comprising:
a patterned protective backing layer comprising a first portion coupled to the first side of the substrate, a second portion coupled to the second side of the substrate, and an opening adjacent to the first curved edge portion of the substrate; and
an electrophorescent display (EPD) module comprising an electrophorescent material layer, wherein the EPD module is coupled to the first portion of the patterned protective backing layer, extends around the first curved edge portion of the substrate, and is coupled to the second portion of the patterned protective backing layer.

8. An electronic device comprising:
a substrate having a first side, an opposing second side, and a first curved edge portion;
a patterned protective backing layer comprising a first portion coupled to the first side of the substrate, a second portion coupled to the second side of the substrate, and an opening adjacent to the first curved edge portion of the substrate;
an electrophorescent display (EPD) module comprising a TFT backplane and an electrophoretic material layer, wherein the EPD module is coupled to the first portion of the patterned protective backing layer, extends around the first curved edge portion of the substrate, and is coupled to the second portion of the patterned protective backing layer; and
a front protective sheet coupled to the EPD module, wherein the front protective sheet includes a first portion that overlies the first side of the substrate, a second portion that extends around the first curved edge portion of the substrate, and a third portion that overlies the second side of the substrate.

9. The electronic device of claim 8, further comprising:
a display driver circuit coupled to a first side of the TFT backplane;
wherein the second portion of the patterned protective backing layer is coupled to a second side of the TFT backplane opposite the display driver circuit.

10. The electronic device of claim 8, wherein:
the first portion and the second portion of the patterned protective backing layer comprise one or more of the following: polyester, polyethylene terephthalate, polyethylene, high-density polyethylene, low-density polyethylene, polypropylene, polyamide, or polyurethane.

11. The electronic device of claim 8, wherein:
the substrate further comprises a second curved edge portion opposite the first curved edge portion;
the TFT backplane extends around the second curved edge portion of the substrate; and
the front protective sheet includes a fourth portion that extends around the second curved edge portion of the substrate; and
further comprising a first adhesive layer coupled to the first side of the substrate, extending around the first curved edge portion of the substrate, extending around the second curved edge portion of the substrate, and coupled to the second side.

12. The electronic device of claim 8, further comprising:
a first adhesive layer coupled a first side of the EPD module facing the substrate, wherein the first adhesive layer comprises a viscoelastic material; and
a second adhesive layer coupled to a second side of the EPD module opposite the first side, the second adhesive layer being an optically clear adhesive having a modulus of elasticity of between about 100 Pa to about 10 MPa.

13. The electronic device of claim 12, wherein:
the first adhesive layer is coupled to the first and second sides of the substrate, the first portion of the patterned protective backing layer, and the second portion of the patterned protective backing layer; and the second adhesive layer is coupled to EPD module and the front protective sheet.

14. The electronic device of claim 8, wherein:

the front protective sheet includes a fourth portion that extends beyond a portion of the EPD module that is coupled to the second portion of the patterned protective backing layer, wherein the fourth portion of the front protective sheet is directly attached to the second side of the substrate.

15. An electronic device comprising:

a substrate having a first side, an opposing second side, and a first curved edge portion;

a first adhesive layer coupled to the first side, extending around the first curved edge portion, and coupled to the second side, wherein the first adhesive layer comprises a viscoelastic material;

a display subassembly coupled to the substrate by the first adhesive layer such that the display subassembly overlies the first side, extends around the first curved edge portion, and overlies the second side;

a second adhesive layer coupled to the display subassembly; and a front protective sheet coupled to the display subassembly by the second adhesive layer such that the front protective sheet overlies the first side, extends around the first curved edge portion, and overlies the second side.

16. The electronic device of claim 15, wherein:

the first adhesive layer comprises one or more of the following: a thermoplastic elastomer, a styrene-butadiene block copolymer, or a interpenetration network polymer.

17. The electronic device of claim 15, wherein:

the second adhesive layer comprises one or more of a polybutadiene or a silicone optically clear adhesive.

18. The electronic device of claim 15, wherein:

the substrate further comprises a second curved edge portion opposite the first curved edge portion, the second curved edge portion extending from the first side to the second side;

the first adhesive layer extends around the second curved edge portion of the substrate;

the display subassembly extends around the second curved edge portion of the substrate; and the front protective sheet includes a portion that extends around the second curved edge portion of the substrate.

19. The electronic device of claim 15, wherein:

the front protective sheet includes a first portion that extends beyond a portion of the display subassembly that overlies the second side of the substrate, wherein the first portion of the front protective sheet is directly attached to the second side of the substrate.

20. The electronic device of claim 15, further comprising:

a patterned protective backing layer comprising a first portion coupled to the first side of the substrate, a second portion coupled to the second side of the substrate, and an opening adjacent to the first curved edge portion of the substrate; and an electrophorescent display (EPD) module comprising an electrophorescent material layer, wherein the EPD module is coupled to the first portion of the patterned protective backing layer, extends around the first curved edge portion of the substrate, and is coupled to the second portion of the patterned protective backing layer.

* * * * *